United States Patent
Oshima et al.

(10) Patent No.: US 10,340,461 B2
(45) Date of Patent: Jul. 2, 2019

(54) COMPOSITION FOR FORMING HOLE COLLECTING LAYER OF PHOTOSENSOR ELEMENT, AND PHOTOSENSOR ELEMENT

(71) Applicant: NISSAN CHEMICAL INDUSTRIES, LTD., Tokyo (JP)

(72) Inventors: Juro Oshima, Funabashi (JP); Takuji Yoshimoto, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/558,676

(22) PCT Filed: Mar. 16, 2016

(86) PCT No.: PCT/JP2016/058306
§ 371 (c)(1),
(2) Date: Sep. 15, 2017

(87) PCT Pub. No.: WO2016/148184
PCT Pub. Date: Sep. 22, 2016

(65) Prior Publication Data
US 2018/0114915 A1 Apr. 26, 2018

(30) Foreign Application Priority Data

Mar. 17, 2015 (JP) ................................. 2015-053279
Apr. 30, 2015 (JP) ................................. 2015-092720
Feb. 3, 2016 (JP) ................................. 2016-019005

(51) Int. Cl.
| | | |
|---|---|---|
| *H01L 51/00* | (2006.01) | |
| *C08G 73/00* | (2006.01) | |
| *C08G 61/12* | (2006.01) | |
| *H01L 27/146* | (2006.01) | |
| *H01L 51/42* | (2006.01) | |

(52) U.S. Cl.
CPC ........ *H01L 51/0059* (2013.01); *C08G 61/122* (2013.01); *C08G 61/126* (2013.01); *C08G 73/00* (2013.01); *H01L 51/0035* (2013.01); *H01L 51/0036* (2013.01); *H01L 51/0052* (2013.01); *H01L 51/0058* (2013.01); *H01L 51/0068* (2013.01); *C08G 2261/3223* (2013.01); *H01L 27/14643* (2013.01); *H01L 51/0047* (2013.01); *H01L 51/42* (2013.01); *H01L 51/4253* (2013.01)

(58) Field of Classification Search
CPC ............. H01L 51/0059; H01L 51/0068; H01L 51/0047; H01L 51/0036; H01L 51/0035; H01L 51/42; H01L 27/14643; Y02E 10/549; C08L 79/00
USPC .......................................................... 257/40
See application file for complete search history.

(56) References Cited

U.S. PATENT DOCUMENTS

2007/0031699 A1* 2/2007 Yamada ................. C08G 61/00
428/690
2014/0230900 A1 8/2014 Cull et al.
2015/0042693 A1 2/2015 Hirata

FOREIGN PATENT DOCUMENTS

| JP | 2002-83946 A | 3/2002 |
| JP | 2014-534606 A | 12/2014 |
| WO | WO 2010/110164 A1 | 9/2010 |
| WO | WO 2013/042613 A1 | 3/2013 |

(Continued)

OTHER PUBLICATIONS

Okubo, WO2010110164.*

(Continued)

*Primary Examiner* — Caleen O Sullivan
(74) *Attorney, Agent, or Firm* — Birch, Stewart, Kolasch & Birch, LLP

(57) ABSTRACT

A photosensor element that is capable of achieving a good balance between high photoelectric conversion efficiency and low dark current is able to be obtained by using a composition for forming a hole collecting layer of a photosensor element, which contains an organic solvent and a charge-transporting material that is composed, for example, of an aniline derivative or thiophene derivative represented by one of formulae (AA)-(DD) and having a molecular weight of 200-2,000.

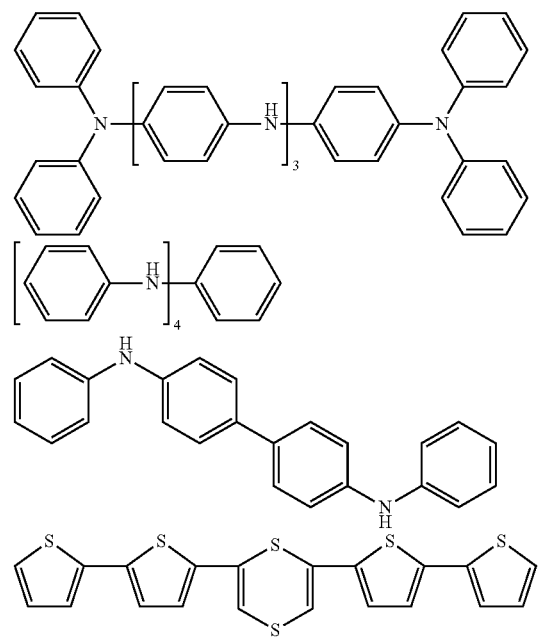

11 Claims, No Drawings

(56) References Cited

FOREIGN PATENT DOCUMENTS

| | | |
|---|---|---|
| WO | WO 2014/119782 A1 | 8/2014 |
| WO | WO 2014/141998 A1 | 9/2014 |
| WO | WO 2014/148415 A1 | 9/2014 |
| WO | WO 2014/203818 A1 | 12/2014 |

OTHER PUBLICATIONS

Haruka, WO2014141998.*
International Search Report, issued in PCT/JP2016/058306 (PCT/ISA/210), dated May 24, 2016.
Extended European Search Report dated Oct. 12, 2018, in European Patent Application No. 16765013.4.

* cited by examiner

COMPOSITION FOR FORMING HOLE COLLECTING LAYER OF PHOTOSENSOR ELEMENT, AND PHOTOSENSOR ELEMENT

TECHNICAL FIELD

The present invention relates to a composition for forming a hole-collecting layer of a photosensor element, and a photosensor element.

BACKGROUND ART

Photoelectron multipliers which utilize the photoelectric effect and photodiodes which utilize pn junctions have hitherto been used as photosensors. Such photosensors are employed in a broad range of applications that include not only light sensing, but also, as solid-state imaging devices, image sensors for civilian use and on-board applications in vehicles.

Lately, given current trends toward smaller sizes and lighter weights, and also the importance placed on low cost and decorative design, organic photosensors that use organic materials in the photoelectric conversion layers are being developed and have been attracting attention.

Organic photosensors are constructed of, for example, a photoelectric conversion layer, charge (hole, electron) collecting layers, electrodes (anode, cathode) and an optical filter.

Of these, the photoelectric conversion layer and the charge-collecting layers are generally formed by a vacuum deposition process. However, vacuum deposition has drawbacks in terms of, for example, its complexity as a mass production process, the high cost of the equipment, and the efficiency of material utilization.

In light of these drawbacks, water-dispersible polymeric organic conductive materials such as PEDOT/PSS are sometimes used as coating-type materials for forming hole-collecting layers. However, because these are aqueous dispersions, the complete removal of moisture and the control of moisture reabsorption are difficult, which tends to accelerate device deterioration.

Moreover, there remain a variety of challenges facing the use of aqueous dispersions of PEDOT/PSS in mass production. Namely, because such dispersions are prone to solids agglomeration, defects readily arise in applied films made thereof and the coating equipment has a tendency to clog or corrode, in addition to which the applied films leave something to be desired in terms of heat resistance.

Also, in photosensors, an external electrical field is generally applied on account of the need to maximize the light-receiving properties (see Patent Document 1).

Although applying an external electrical field is likely to improve the light-receiving sensitivity and the response speed, the injection of holes and electrons from the electrodes arises, resulting in an increase in the dark current.

Because this increase in dark current is a factor that lowers the detection sensitivity, in order to create devices having a high light-receiving sensitivity, suppression of the dark current while continuing to exhibit a high photoelectric conversion efficiency is important.

PRIOR ART DOCUMENTS

Patent Documents

Patent Document 1: JP-A 2002-83946

SUMMARY OF THE INVENTION

Problems to be Solved by the Invention

The present invention was arrived at in light of the above circumstances. One object of the invention is to provide a composition for forming a hole-collecting layer of a photosensor element, which composition gives a photosensor element that is capable of having both a high photoelectric conversion efficiency and a low dark current.

Means for Solving the Problems

The inventors have conducted extensive investigations in order to attain the above objects. As a result, they have discovered that a photosensor element in which a thin film created from a composition that includes a relatively low-molecular-weight charge-transporting substance and an organic solvent is used as a hole-collecting layer is capable of having both a high photoelectric conversion efficiency and a low dark current.

Accordingly, the Invention Provides:
1. A composition for forming a hole-collecting layer of a photosensor element, which composition includes a charge-transporting substance having a molecular weight of from 200 to 2,000 and an organic solvent;
2. The photosensor element hole-collecting layer-forming composition of 1 above, wherein the charge-transporting substance is at least one selected from the group consisting of aniline derivatives and thiophene derivatives;
3. The photosensor element hole-collecting layer-forming composition of 1 or 2 above which further includes an electron-accepting dopant substance;
4. The photosensor element hole-collecting layer-forming composition of any of 1 to 3 above, wherein the electron-accepting dopant substance includes an arylsulfonic acid compound;
5. The photosensor element hole-collecting layer-forming composition of 4 above, wherein the arylsulfonic acid compound is a naphthalene or anthracenesulfonic acid compound of formula (D1) below

[Chemical Formula 1]

(wherein Z is oxygen; A is a naphthalene ring or an anthracene ring; B is a divalent to tetravalent perfluorobiphenyl group; the subscript s, which represents the number of sulfonic acid groups bonded to A, is an integer that satisfies the condition $1 \leq s \leq 4$; and the subscript t, which represents the number of bonds between B and Z, is an integer from 2 to 4), naphthalenetrisulfonic acid or polystyrenesulfonic acid;
6. The photosensor element hole-collecting layer-forming composition of 5 above, wherein A is a naphthalene ring;

7. The photosensor element hole-collecting layer-forming composition of any of 1 to 6 above which further includes an organosilane compound;
8. A photosensor element comprising a hole-collecting layer made from the photosensor element hole-collecting layer-forming composition of any of 1 to 7 above, and a photoelectric conversion layer provided so as to be in contact therewith;
9. The photosensor element of 8 above, wherein the photoelectric conversion layer includes a fullerene derivative;
10. The photosensor element of 8 above, wherein the photoelectric conversion layer includes a polymer having a thiophene skeleton on the main chain; and
11. The photosensor element of 8 above, wherein the photoelectric conversion layer includes a fullerene derivative and a polymer having a thiophene skeleton on the main chain.

Advantageous Effects of the Invention

By using the inventive composition for forming a hole-collecting layer of a photosensor element, a photosensor element that achieves both a high photoelectric conversion efficiency and a low dark current can be obtained.

Also, because the inventive composition is a uniform organic solution, it is highly compatible with mass production processes. Moreover, because it exhibits a high uniform film formability while planarizing the underlying anode having surface irregularities, a high device yield can be achieved.

Finally, the hole-collecting layer created from the inventive composition exhibits a high heat resistance, and thus can withstand various high-temperature processes following film formation.

EMBODIMENT FOR CARRYING OUT THE INVENTION

The invention is described in greater detail below.

The inventive composition for forming a hole-collecting layer of a photosensor element includes a charge-transporting substance having a molecular weight of from 200 to 2,000 and an organic solvent.

Although the molecular weight of the charge-transporting substance used in the invention is from 200 to 2,000, taking into account the electrical conductivity, the lower limit is preferably 300 or more, and more preferably 400 or more. From the standpoint of increasing the solubility in solvents, the upper limit is preferably 1,500 or less, and more preferably 1,000 or less.

The charge-transporting substance is not particularly limited so long as it satisfies the above molecular weight; one that is suitably selected and used from among known charge-transporting substances may be used. Aniline derivatives and thiophene derivatives are preferred, with aniline derivatives being especially preferred.

Illustrative examples of such aniline derivatives and thiophene derivatives include those disclosed in WO 2005/043962, WO 2013/042623 and WO 2014/141998.

Specific examples include aniline derivatives and thiophene derivatives of formulas (H1) to (H3) below.

[Chemical Formula 2]

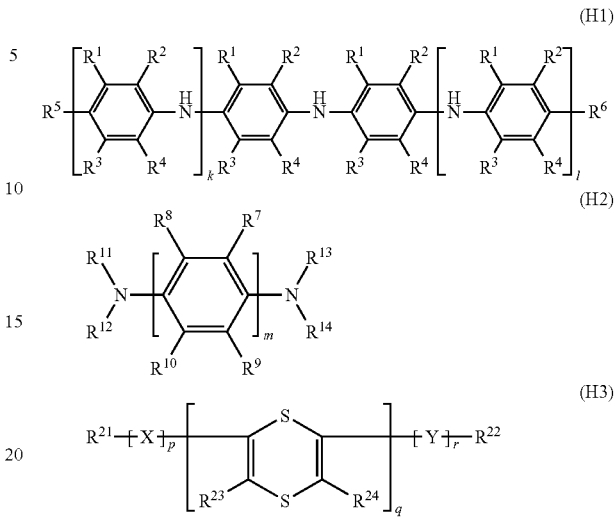

The aniline derivative of formula (H1) may be an oxidized aniline derivative having within the molecule a quinonediimine structure of the following formula (quinonediimine derivative). Methods for oxidizing the aniline derivative to form a quinonediimine derivative are exemplified by the methods described in WO 2008/010474 and WO 2014/119782.

[Chemical Formula 3]

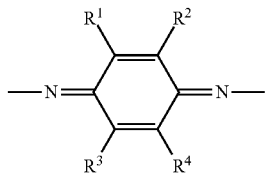

In formula (H1), $R^1$ to $R^6$ are each independently a hydrogen atom, a halogen atom, a nitro group, a cyano group, an amino group, an alkyl group of 1 to 20 carbon atoms, alkenyl group of 2 to 20 carbon atoms or alkynyl group of 2 to 20 carbon atoms which may be substituted with $Z^1$, an aryl group of 6 to 20 carbon atoms or heteroaryl group of 2 to 20 carbon atoms which may be substituted with $Z^2$, or a —$NHY^1$, —$NY^2Y^3$, —$OY^4$ or —$SY^5$ group; $Y^1$ to $Y^5$ are each independently an alkyl group of 1 to 20 carbon atoms, alkenyl group of 2 to 20 carbon atoms or alkynyl group of 2 to 20 carbon atoms which may be substituted with $Z^1$, or an aryl group of 6 to 20 carbon atoms or heteroaryl group of 2 to 20 carbon atoms which may be substituted with $Z^2$; $Z^1$ is a halogen atom, a nitro group, a cyano group, an amino group, or an aryl group of 6 to 20 carbon atoms or heteroaryl group of 2 to 20 carbon atoms which may be substituted with $Z^3$; $Z^2$ is a halogen atom, a nitro group, a cyano group, an amino group, or an alkyl group of 1 to 20 carbon atoms, alkenyl group of 2 to 20 carbon atoms or alkynyl group of 2 to 20 carbon atoms which may be substituted with $Z^3$; $Z^3$ is a halogen atom, a nitro group, a cyano group, or an amino group; and the letters k and l are each independently integers from 1 to 5.

In formula (H2), $R^7$ to $R^{10}$ are each independently a hydrogen atom, a halogen atom, a nitro group, a cyano group, a hydroxyl group, a thiol group, a phosphoric acid group, a sulfonic acid group, a carboxyl group, an alkoxy group of 1 to 20 carbon atoms, thioalkoxy group of 1 to 20 carbon atoms, alkyl group of 1 to 20 carbon atoms, alkenyl group of 2 to 20 carbon atoms or alkynyl group of 2 to 20 carbon atoms which may be substituted with $Z^1$, or an aryl group of 6 to 20 carbon atoms, aralkyl group of 7 to 20 carbon atoms or acyl group of 1 to 20 carbon atoms which may be substituted with $Z^2$; $R^{11}$ to $R^{14}$ are each independently a hydrogen atom, a phenyl, naphthyl, pyridyl, pyrimidinyl, pyridazinyl, pyrazinyl, furanyl, pyrrolyl, pyrazolyl, imidazolyl or thienyl group (which groups may be substituted with a halogen atom, a nitro group, a cyano group, a hydroxyl group, a thiol group, a phosphoric acid group, a sulfonic acid group, a carboxyl group, an alkoxy group of 1 to 20 carbon atoms, a thioalkoxy group of 1 to 20 carbon atoms, an alkyl group of 1 to 20 carbon atoms, a haloalkyl group of 1 to 20 carbon atoms, an alkenyl group of 2 to 20 carbon atoms, an alkynyl group of 2 to 20 carbon atoms, an aryl group of 6 to 20 carbon atoms, an aralkyl group of 7 to 20 carbon atoms, or an acyl group of 1 to 20 carbon atoms), or a group of formula (H4) (provided that at least one of $R^{11}$ to $R^{14}$ is a hydrogen atom); m is an integer from 2 to 5; and $Z^1$ and $Z^2$ are as defined above.

[Chemical Formula 4]

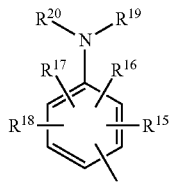

(H4)

In formula (H4), $R^{15}$ to $R^{18}$ are each independently a hydrogen atom, a halogen atom, a nitro group, a cyano group, a hydroxyl group, a thiol group, a phosphoric acid group, a sulfonic acid group, a carboxyl group, an alkoxy group of 1 to 20 carbon atoms, thioalkoxy group of 1 to 20 carbon atoms, alkyl group of 1 to 20 carbon atoms, alkenyl group of 2 to 20 carbon atoms or alkynyl group of 2 to 20 carbon atoms which may be substituted with $Z^1$, or an aryl group of 6 to 20 carbon atoms, aralkyl group of 7 to 20 carbon atoms or acyl group of 1 to 20 carbon atoms which may be substituted with $Z^2$; $R^{19}$ and $R^2$ are each independently a phenyl, naphthyl, anthryl, pyridyl, pyrimidinyl, pyridazinyl, pyrazinyl, furanyl, pyrrolyl, pyrazolyl group, imidazolyl or thienyl group (which groups may be bonded to each other to form a ring or may be substituted with a halogen atom, a nitro group, a cyano group, a hydroxyl group, a thiol group, a phosphoric acid group, a sulfonic acid group, a carboxyl group, an alkoxy group of 1 to 20 carbon atoms, a thioalkoxy group of 1 to 20 carbon atoms, an alkyl group of 1 to 20 carbon atoms, a haloalkyl group of 1 to 20 carbon atoms, an alkenyl group of 2 to 20 carbon atoms, an alkynyl group of 2 to 20 carbon atoms, an aryl group of 6 to 20 carbon atoms, an aralkyl group of 7 to 20 carbon atoms, or an acyl group of 1 to 20 carbon atoms); and $Z^1$ and $Z^2$ are as defined above.

In formula (H3), $R^{21}$ to $R^{24}$ are each independently a hydrogen atom, a halogen atom, a hydroxyl group, an amino group, a silanol group, a thiol group, a carboxyl group, a sulfonic acid group, a phosphoric acid group, a phosphoric acid ester group, an ester group, a thioester group, an amide group, a nitro group, an alkyl group of 1 to 20 carbon atoms, alkenyl group of 2 to 20 carbon atoms or alkynyl group of 2 to 20 carbon atoms which may be substituted with $Z^1$, an aryl group of 6 to 20 carbon atoms, aralkyl group of 7 to 20 carbon atoms or acyl group of 1 to 20 carbon atoms which may be substituted with $Z^2$, a sulfonic acid group, or a —$NHY^1$, —$NY^2Y^3$, —$OY^4$, —$SY^5$ or —$SiY^6Y^7Y^8$ group; $Y^1$ to $Y^8$ are each independently an alkyl group of 1 to 20 carbon atoms, alkenyl group of 2 to 20 carbon atoms or alkynyl group of 2 to 20 carbon atoms which may be substituted with $Z^1$, or an aryl group of 6 to 20 carbon atoms or heteroaryl group of 2 to 20 carbon atoms which may be substituted with $Z^2$; X and Y are each independently a thiophene ring which may be substituted with $Z^2$; the two sulfur atoms included on the dithiine ring may be each independently a SO group or a $SO_2$ group; p, q and r are each independently 0 or an integer of 1 or more, these being numbers that together satisfy the condition p+q+r≤20; and $Z^1$ and $Z^2$ are as defined above.

In each of the above formulas, the halogen atom is exemplified by fluorine, chlorine, bromine and iodine atoms.

The alkyl group of 1 to 20 carbon atoms may be linear, branched or cyclic. Illustrative examples include linear or branched alkyl groups of 1 to 20 carbon atoms, such as methyl, ethyl, n-propyl, isopropyl, n-butyl, isobutyl, s-butyl, t-butyl, n-pentyl, n-hexyl, n-heptyl, n-octyl, n-nonyl and n-decyl groups; and cyclic alkyl groups of 3 to 20 carbon atoms, such as cyclopropyl, cyclobutyl, cyclopentyl, cyclohexyl, cycloheptyl, cyclooctyl, cyclononyl, cyclodecyl, bicyclobutyl, bicyclopentyl, bicyclohexyl, bicycloheptyl, bicyclooctyl, bicyclononyl and bicyclodecyl groups.

Illustrative examples of alkenyl groups of 2 to 20 carbon atoms include ethenyl, n-1-propenyl, n-2-propenyl, 1-methylethenyl, n-1-butenyl, n-2-butenyl, n-3-butenyl, 2-methyl-1-propenyl, 2-methyl-2-propenyl, 1-ethylethenyl, 1-methyl-1-propenyl, 1-methyl-2-propenyl, n-1-pentenyl, n-1-decenyl and n-1-eicosenyl groups.

Illustrative examples of alkynyl groups of 2 to 20 carbon atoms include ethynyl, n-1-propynyl, n-2-propynyl, n-1-buynyl, n-2-butynyl, n-3-butynyl, 1-methyl-2-propynyl, n-1-pentynyl, n-2-pentynyl, n-3-pentynyl, n-4-pentynyl, 1-methyl-n-butynyl, 2-methyl-n-butynyl, 3-methyl-n-butynyl, 1,1-dimethyl-n-propynyl, n-1-hexynyl, n-1-decynyl, n-1-pentadecynyl and n-1-eicosynyl groups.

Illustrative examples of aryl groups of 6 to 20 carbon atoms include phenyl, 1-naphthyl, 2-naphthyl, 1-anthryl, 2-anthryl, 9-anthryl, 1-phenanthryl, 2-phenanthryl, 3-phenanthryl, 4-phenanthryl and 9-phenanthryl groups.

Illustrative examples of aralkyl groups of 7 to 20 carbon atoms include benzyl, phenylethyl, phenylpropyl, naphthylmethyl, naphthylethyl and naphthylpropyl groups.

Illustrative examples of heteroaryl groups of 2 to 20 carbon atoms include 2-thienyl, 3-thienyl, 2-furanyl, 3-furanyl, 2-oxazolyl, 4-oxazolyl, 5-oxazolyl, 3-isooxazolyl, 4-isooxazolyl, 5-isooxazolyl, 2-thiazolyl, 4-thiazolyl, 5-thiazolyl, 3-isothiazolyl, 4-isothiazolyl, 5-isothiazolyl, 2-imidazolyl, 4-imidazolyl, 2-pyridyl, 3-pyridyl and 4-pyridyl groups.

Haloalkyl groups of 1 to 20 carbon atoms are exemplified by those in which at least one hydrogen atom on the above-mentioned alkyl groups of 1 to 20 carbon atoms is substituted with a halogen atom. Of these, fluoroalkyl groups are preferred, and perfluoroalkyl groups are more preferred.

Illustrative examples include fluoromethyl, difluoromethyl, trifluoromethyl, pentafluoroethyl, 2,2,2-trifluoroethyl, heptafluoropropyl, 2,2,3,3,3-pentafluoropropyl, 2,2,3,3-tetrafluoropropyl, 2,2,2-trifluoro-1-(trifluoromethyl)ethyl, nonafluorobutyl, 4,4,4-trifluorobutyl, undecafluoropentyl, 2,2,3,3,4,4,5,5,5-nonafluoropentyl, 2,2,3,3,4,4,5,5-octafluoropentyl, tridecafluorohexyl, 2,2,3,3,4,4,5,5,6,6,6-undecafluorohexyl, 2,2,3,3,4,4,5,5,6,6-decafluorohexyl and 3,3,4,4,5,5,6,6,6-nonafluorohexyl groups.

Illustrative examples of alkoxy groups of 1 to 20 carbon atoms include methoxy, ethoxy, n-propoxy, i-propoxy, c-propoxy, n-butoxy, i-butoxy, s-butoxy, t-butoxy, n-pentoxy, n-hexoxy, n-heptyloxy, n-octyloxy, n-nonyloxy, n-decyloxy, n-undecyloxy, n-dodecyloxy, n-tridecyloxy, n-tetradecyloxy, n-pentadecyloxy, n-hexadecyloxy, n-heptadecyloxy, n-octadecyloxy, n-nonadecyloxy and n-eicosanyloxy groups.

Illustrative examples of thioalkoxy (alkylthio) groups of 1 to 20 carbon atoms include methylthio, ethylthio, n-propylthio, isopropylthio, n-butylthio, isobutylthio, s-butylthio, t-butylthio, n-pentylthio, n-hexylthio, n-heptylthio, n-octylthio, n-nonylthio, n-decylthio, n-undecylthio, n-dodecylthio, n-tridecylthio, n-tetradecylthio, n-pentadecylthio, n-hexadecylthio, n-heptadecylthio, n-octadecylthio, n-nonadecylthio and n-cicosanylthio groups.

Illustrative examples of acyl groups of 1 to 20 carbon atoms include formyl, acetyl, propionyl, butyryl, isobutyryl, valeryl, isovaleryl and benzoyl groups.

In formula (H-1), $R^1$ to $R^6$ are preferably hydrogen atoms, halogen atoms, alkyl groups of 1 to 20 carbon atoms which may be substituted with $Z^1$, aryl groups of 6 to 20 carbon atoms which may be substituted with $Z^2$, —$NHY^1$, —$NY^2Y^3$, —$OY^4$ or —$SY^5$. In this case, $Y^1$ to $Y^5$ are preferably alkyl groups of 1 to 10 carbon atoms which may be substituted with $Z^1$ or aryl groups of 6 to 10 carbon atoms which may be substituted with $Z^2$; more preferably alkyl groups of 1 to 6 carbon atoms which may be substituted with $Z^1$ or phenyl groups which may be substituted with $Z^2$; and even more preferably alkyl groups of 1 to 6 carbon atoms or phenyl groups.

In particular, $R^1$ to $R^6$ are more preferably hydrogen atoms, fluorine atoms, methyl groups, phenyl groups or diphenylamino groups (—$NY^2Y^3$ in which $Y^2$ and $Y^3$ are phenyl groups). It is even more preferable for $R^1$ to $R^4$ to be hydrogen atoms and for $R^5$ and $R^6$ to be either both hydrogen atoms or both diphenylamino groups.

In particular, in $R^1$ to $R^6$ and $Y^1$ to $Y^5$, $Z^1$ is preferably a halogen atom or an aryl group of 6 to 10 carbon atoms which may be substituted with $Z^3$, more preferably a fluorine atom or a phenyl group, and even more preferably does not exist (i.e., is a non-substituting group); and $Z^2$ is preferably a halogen atom or an alkyl group of 1 to 10 carbon atoms which may be substituted with $Z^3$, more preferably a fluorine atom or an alkyl group of 1 to 6 carbon atoms, and even more preferably does not exist (i.e., is a non-substituting group).

$Z^3$ is preferably a halogen atom, more preferably a fluorine atom, and even more preferably does not exist (i.e., is a non-substituting group).

From the standpoint of increasing the solubility of the aniline derivative of formula (H1), the letters k and l preferably satisfy the condition k+l≤8, and more preferably satisfy the condition k+l≤5.

In formula (H2), $R^7$ to $R^{10}$ are preferably hydrogen atoms, halogen atoms, alkyl groups of 1 to 4 carbon atoms, perfluoroalkyl groups of 1 to 4 carbon atoms or alkoxy groups of 1 to 4 carbon atoms; and are more preferably hydrogen atoms.

To increase the solubility of the aniline derivative of formula (H2) in solvents and also increase the uniformity of the thin film obtained, $R^{11}$ and $R^{13}$ are preferably both hydrogen atoms.

In particular, it is preferable for $R^{11}$ and $R^{13}$ to both be hydrogen atoms and for $R^{12}$ and $R^{14}$ to each be independently a phenyl group (which phenyl group may be substituted with a halogen atom, a nitro group, a cyano group, a hydroxyl group, a thiol group, a phosphoric acid group, a sulfonic acid group, a carboxyl group, an alkoxy group of 1 to 20 carbon atoms, a thioalkoxy group of 1 to 20 carbon atoms, an alkyl group of 1 to 20 carbon atoms, a haloalkyl group of 1 to 20 carbon atoms, an alkenyl group of 2 to 20 carbon atoms, an alkynyl group of 2 to 20 carbon atoms, an aryl group of 6 to 20 carbon atoms, an aralkyl group of 7 to 20 carbon atoms or an acyl group of 1 to 20 carbon atoms) or a group of above formula (H4); more preferable for $R^{11}$ and $R^{13}$ to both be hydrogen atoms and $R^{12}$ and $R^{14}$ to each be independently a phenyl group or a group of formula (H4') below in which $R^{19'}$ and $R^{20'}$ are both phenyl groups; and even more preferable for $R^{11}$ and $R^{13}$ to both be hydrogen atoms and $R^{12}$ and $R^{14}$ to both be phenyl groups.

Also, the subscript m, based on such considerations as the availability of the compound, ease of preparation and cost, is preferably from 2 to 4. To increase the solubility of the compound in solvents, m is more preferably 2 or 3. For a good balance among the compound availability, ease of preparation, production cost and solubility in solvents and the transparency of the resulting thin film, m is most preferably 2.

[Chemical Formula 5]

(H4')

In formula (H3), $R^{21}$ to $R^{24}$ are preferably hydrogen atoms, fluorine atoms, sulfonic acid groups, alkyl groups of 1 to 8 carbon atoms, —$OY^4$ groups or —$SiY^6Y^7Y^8$ groups, and more preferably hydrogen atoms.

From the standpoint of increasing the solubility of the compound, the letters p, q and r are preferably each 1 or more, with p+q+r≤20; and are more preferably each 1 or more, with p+q+r≤10. In addition, to achieve a high charge transportability, it is preferable for the letters p, q and r to each be 1 or more, with 5≤p+q+r; and it is more preferable for q to be 1 and for p and r to each be 1 or more, with 5≤p+q+r.

The aniline derivative or thiophene derivative of formulas (H1) to (H3) that is used may be a commercial product or may be a compound synthesized by a known method such as the methods mentioned in the above-cited publications. In either case, it is preferable to use a compound that has been purified by a process such as recrystallization or vapor deposition prior to preparation of the hole-collecting layer-forming composition. By using a compound that has been purified, it is possible to further increase the characteristics of photosensor elements having a thin film obtained from this composition. In the case of purification by recrystallization, the solvent used may be, for example, 1,4-dioxane or tetrahydrofuran.

In the hole-collecting layer-forming composition of the invention, a single compound (i.e., for which the molecular weight distribution has a dispersity of 1) selected from compounds of formulas (H1) to (H3) may be used singly, or two or more such compounds may be used in combination as the charge-transporting substance of formula (H1) to (H3).

In particular, from the standpoint of increasing the transparency of the hole-collecting layer, the use of an aniline derivative of formula (H2) is preferred, the use of a benzidine derivative in which the letter m is 2 is more preferred, and the use of a diphenylbenzidine of formula (g) below is even more preferred.

Examples of charge-transporting substances that may be preferably used in the invention include, but are not limited to, those shown below.

[Chemical Formula 6]

(a)
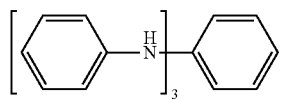

(b)
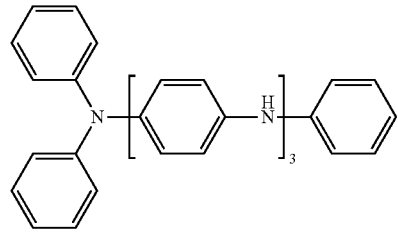

(c)
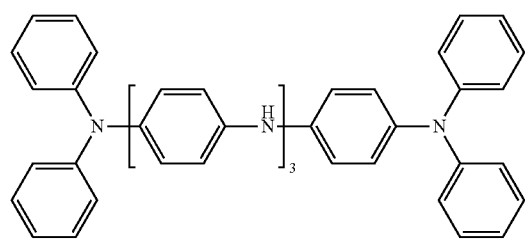

(d)
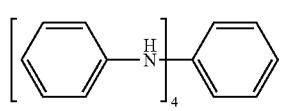

(e)
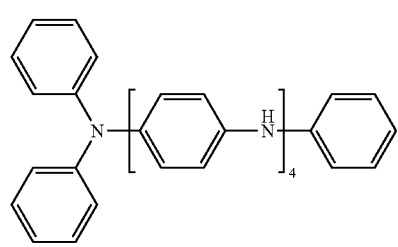

(f)
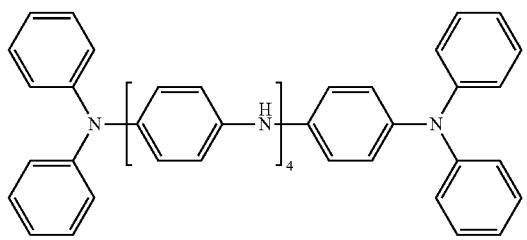

[Chemical Formula 7]

(g)
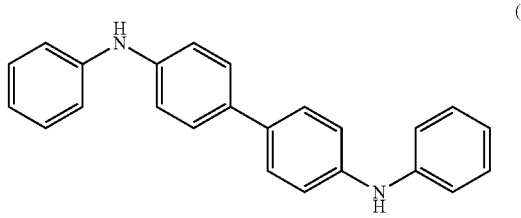

(h)
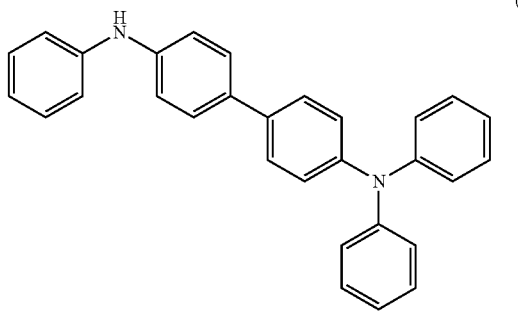

(i)
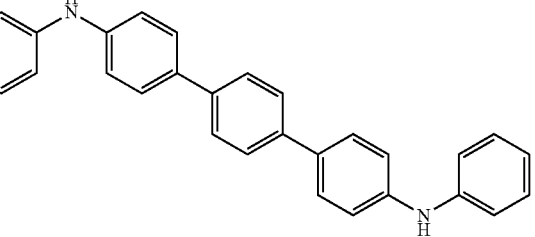

(j)
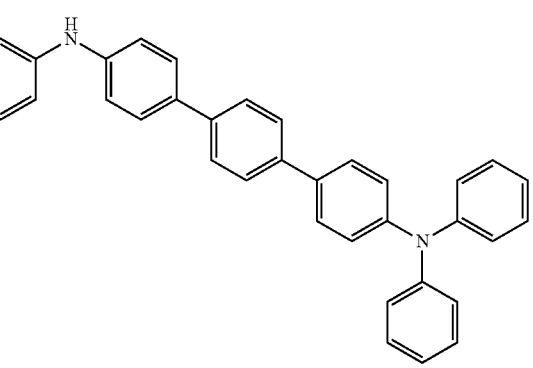

[Chemical Formula 8]

(k)
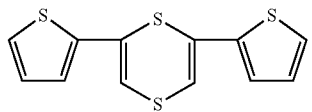

(l)
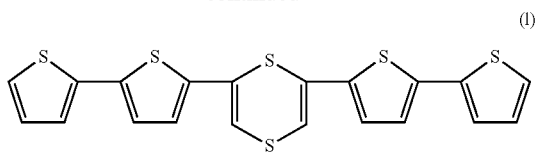

(m)

(n)
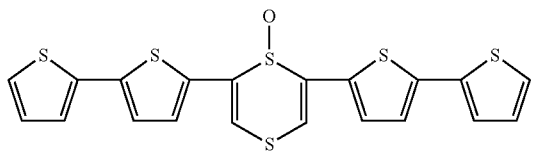

(o)
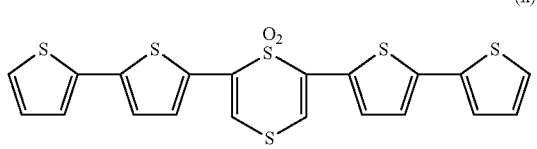

(p)
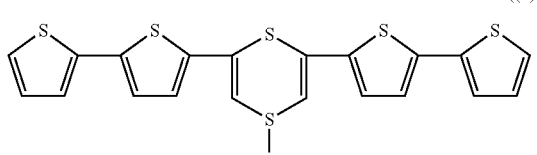

(q)
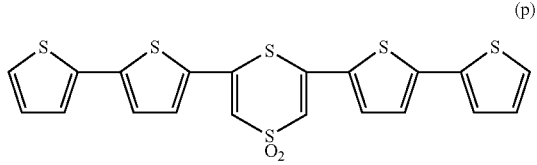

(r)
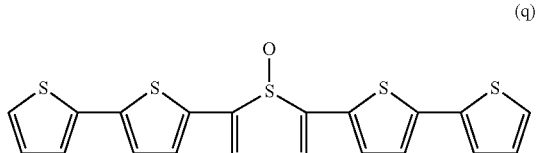

(s)
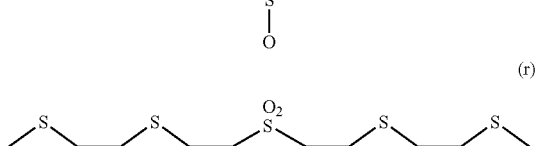

(t)
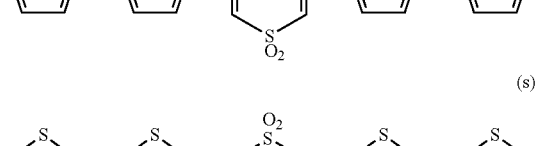

(u)
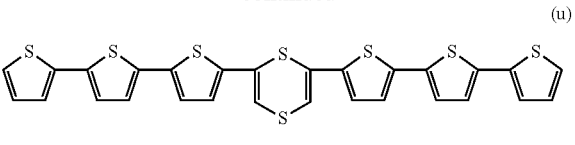

The hole-collecting layer-forming composition of the invention includes the above-described charge-transporting substance and an organic solvent. Depending on the intended use of the resulting thin film, an electron-accepting dopant substance may be included for the purpose of, e.g., increasing the photoelectric conversion efficiency of the resulting photosensor element.

The electron-accepting dopant substance is not particularly limited, provided it dissolves in at least one of the solvents used in the hole-collecting layer-forming composition.

Specific examples of electron-accepting dopant substances include strong inorganic acids such as hydrogen chloride, sulfuric acid, nitric acid and phosphoric acid; Lewis acids such as aluminum(III) chloride ($AlCl_3$), titanium(IV) tetrachloride ($TiCl_4$), boron tribromide ($BBr_3$), a boron trifluoride-ether complex ($BF_3 \cdot OEt_2$), iron(III) chloride ($FeCl_3$), copper(II) chloride ($CuCl_2$), antimony(V) pentachloride ($SbCl_5$), arsenic(V) pentafluoride ($AsF_5$), phosphorus pentafluoride ($PF_5$) and tris(4-bromophenyl) aluminum hexachloroantimonate (TBPAH); strong organic acids such as the following arylsulfonic acids: benzenesulfonic acid, tosylic acid, camphorsulfonic acid, hydroxybenzenesulfonic acid, 5-sulfosalicylic acid, dodecylbenzenesulfonic acid, naphthalenedisulfonic acids (e.g., 1,5-naphthalenedisulfonic acid), naphthalenetrisulfonic acids (e.g., 1,3,5-naphthalenetrisulfonic acid, 1,3,6-naphthalenetrisulfonic acid), polystyrenesulfonic acids, the 1,4-benzodioxanedisulfonic acid compounds mentioned in WO 2005/000832, the naphthalene- or anthracenesulfonic acid compounds mentioned in WO 2006/025342, and the dinonylnaphthalenesulfonic acid compounds mentioned in JP-A 2005-108828; organic oxidizing agents such as 7,7,8,8-tetracyanoquinodimethane (TCNQ), 2,3-dichloro-5,6-dicyano-1,4-benzoquinone (DDQ), and iodine; and inorganic oxidizing agents such as heteropolyacids (e.g., the phosphomolybdie acid, phosphotungstic acid and phosphotungstomolybdic acid mentioned in WO 2010/058777). These may be used in combination.

Of these, to obtain photosensor elements having a good photoelectric conversion efficiency, arylsulfonic acid compounds are preferred, with naphthalene- or anthracenesulfonic acid compounds of formula (D1), napthalenetrisulfonic acids such as 1,3,5-naphthalenetrisulfonic acid or 1,3,6-naphthalenetrisulfonic acid, and polystyrenesulfonic acids being especially preferred.

[Chemical Formula 9]

(D1)
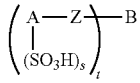

In formula (D1), Z represents oxygen, A is a naphthalene ring or an anthracene ring, B is a divalent to tetravalent perfluorobiphenyl group, the letter s, which represents the number of sulfonic acid groups bonded to A, is an integer that satisfies the condition 1≤s≤4, and the letter t, which represents the number of bonds between B and Z, is an integer from 2 to 4.

Specific examples of naphthalene- or anthracenesulfonic acid compounds of formula (D1) that can be advantageously used in the invention include, but are not limited to, the following naphthalenesulfonic acid compounds (formula (D2)).

[Chemical Formula 10]

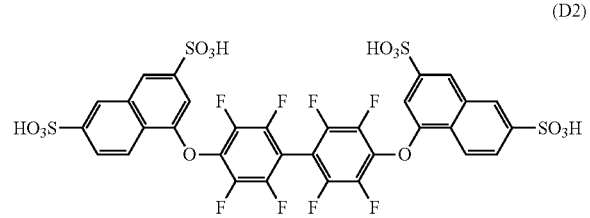

(D2)

High-solvency solvents that are able to dissolve well the above-described charge-transporting substance and the optionally used electron-accepting dopant substance may be used as the organic solvent employed to prepare the hole-collecting layer-forming composition. The high-solvency solvent may be of one type used alone, or two or more may be used in admixture. The amount used may be set to from 5 to 100 wt %, based on the overall solvent using in the composition.

Illustrative examples of such high-solvency solvents include N-methylformamide, N,N-dimethylformamide, N,N-diethylformamide, N-methylacetamide, N,N-dimethylacetamide, N-methylpyrrolidone and 1,3-dimethyl-2-imidazolidinone.

Of these, the amide-type solvents N-methylformamide, N,N-dimethylformamide, N,N-diethylformamide, N-methylacetamide and N,N-dimethylacetamide are preferred. N,N-dimethylacetamide is more preferred.

The charge-transporting substance and electron-accepting dopant substance are preferably both in a completely dissolved state or a uniformly dispersed state within the organic solvent. To reproducibly obtain a hole-collecting layer that provides a photosensor element having a high photoelectric conversion efficiency, it is more preferable for these substances to be completely dissolved within the organic solvent.

The hole-collecting layer-forming composition of the invention preferably includes at least one high-viscosity organic solvent having a viscosity at 25° C. of from 10 to 200 mPa·s, especially from 35 to 150 mPa·s, and a boiling point at standard pressure of from 50 to 300° C., especially from 150 to 250° C.

Examples of high-viscosity organic solvents include, but are not particularly limited to, cyclohexanol, ethylene glycol, 1,3-octylene glycol, diethylene glycol, dipropylene glycol, triethylene glycol, tripropylene glycol, 1,3-butanediol, 2,3-butanediol, 1,4-butanediol, propylene glycol and hexylene glycol.

The addition ratio of high-viscosity organic solvent with respect to the overall solvent used in the hole-collecting layer-forming composition of the invention is preferably in a range within which the deposition of solids does not occur. An addition ratio of from 5 to 80 wt % is preferred, so long as solids do not deposit out.

In addition, another solvent capable of imparting flatness to the film during heat treatment may also be admixed in a ratio with respect to the overall solvent used in the composition of from 1 to 90 wt %, preferably from 1 to 50 wt %, for such purposes as to increase the ability of the composition to wet the surface to which it is applied and to adjust the solvent surface tension, polarity, and boiling point.

Examples of such solvents include, but are not limited to, butyl cellosolve, diethylene glycol diethyl ether, diethylene glycol dimethyl ether, diethylene glycol monoethyl ether acetate, diethylene glycol monobutyl ether acetate, dipropylene glycol monomethyl ether, propylene glycol monomethyl ether, propylene glycol monomethyl ether acetate, ethyl carbitol, diacetone alcohol, γ-butyrolactone, ethyl lactate and n-hexyl acetate.

In order to increase the electron-blocking properties of the photosensor element obtained, it is desirable for the hole-collecting film-forming composition of the invention to include an organosilane compound.

The organosilane compound is exemplified by trialkoxysilanes and dialkoxysilanes, with aryltrialkoxysilanes, aryldialkoxysilanes, fluorine atom-containing trialkoxysilanes, and fluorine atom-containing dialkoxysilane compounds being preferred, and silane compounds of formula (S1) or (S2) being more preferred.

[Chemical Formula 11]

(S1)

(S2)

In these formulas, R is a fluoroalkyl group of 1 to 6 carbon atoms.

Specific examples of fluoroalkyl groups of 1 to 6 carbon atoms include trifluoromethyl, 2,2,2-trifluoroethyl, 1,1,2,2,2-pentafluoroethyl, 3,3,3-trifluoropropyl, 2,2,3,3,3-pentafluoropropyl, 1,1,2,2,3,3,3-heptafluoropropyl, 4,4,4-trifluorobutyl, 3,3,4,4,4-pentafluorobutyl, 2,2,3,3,4,4,4-heptafluorobutyl and 1,1,2,2,3,3,4,4,4-nonafluorobutyl groups.

Specific examples of dialkoxysiloxane compounds include dimethyldimethoxysilane, dimethyldiethoxysilane, methylethyldimethoxysilane, diethyldimethoxysilane, diethyldiethoxysilane, methylpropyldimethoxysilane, methylpropyldiethoxysilane, diisopropyldimethoxysilane, phenylmethyldimethoxysilane, vinylmethyldimethoxysilane, 3-glycidoxypropylmethyldimethoxysilane, 3-glycidoxypropylmethyldiethoxysilane, 3-(3,4-epoxycyclohexyl)ethylmethyldimethoxysilane, 3-methacryloxypropylmethyldimethoxysilane, 3-methacryloxypropylmethyldiethoxysilane, 3-mercaptopropylmethyldimethoxysilane, γ-aminopropylmethyldiethoxysilane, N-(2-aminoethyl)aminopropylmethyldimethoxysilane and 3,3,3-trifluoropropylmethyldimethoxysilane.

Specific examples of trialkoxysilane compounds include methyltrimethoxysilane, methyltriethoxysilane, ethyltrimethoxysilane, ethyltriethoxysilane, propyltrimethoxysilane, propyltriethoxysilane, butyltrimethoxysilane, butyltriethoxysilane, pentyltrimethoxysilane, pentyltriethoxysilane, heptyltrimethoxysilane, heptyltriethoxysilane, octyltrimethoxysilane, octyltriethoxysilane, dodecyltrimethoxysilane, dodecyltriethoxysilane, hexadecyltrimethoxysilane, hexadecyltriethoxysilane, octadecyltrimethoxysilane, octadecyltriethoxysilane, phenyltrimethoxysilane, phenyltriethoxysilane, vinyltrimethoxysilane, vinyltriethoxysilane, γ-aminopropyltrimethoxysilane, 3-aminopropyltriethoxysilane, γ-glycidoxypropyltrimethoxysilane, 3-glycidoxypropyltriethoxysilane, γ-methacryloxypropyltrimethoxysilane, γ-methacryloxypropyltriethoxysilane, triethoxy(4-trifluoromethyl)phenyl)silane, dodecyltriethoxysilane, 3,3,3-trifluoropropyltrimethoxysilane, (triethoxysilyl)cyclohexane, perfluorooctylethyltriethoxysilane, triethoxyfluorosilane, tridecafluoro-1,1,2,2-tetrahydrooctyltriethoxysilane, 3-(heptafluoroisopropoxy)propyltriethoxysilane, heptadecafluoro-1,1,2,2-tetrahydrodecyltriethoxysilane, triethoxy-2-thienylsilane and 3-(triethoxysilyl)furan.

In this invention, the content of the organosilane compound, based on the charge-transporting substance and the electron-accepting dopant substance in the inventive composition, is generally from about 0.1 to about 200 wt %, preferably from 1 to 100 wt %, and more preferably from 5 to 50 wt %.

The solids concentration of the inventive composition, which is suitably set while taking into account the viscosity, surface tension and other properties of the composition and the thickness and other properties of the thin film to be produced, is generally from about 0.1 to about 10.0 wt %, preferably from 0.5 to 5 wt %, and more preferably from 1.0 to 3.0 wt %.

As used herein, "solids" refers to the ingredients other than the organic solvent which make up the hole-collecting layer-forming composition.

The molar ratio between the charge-transporting substance and the electron-accepting dopant substance, which is suitably set while taking into account such factors as the charge transportability to be achieved and the type of charge transporting substance, is generally from 0.1 to 10, preferably from 0.2 to 5.0, and more preferably from 0.5 to 3.0, of the electron-accepting dopant substance relative to unity (1) for the charge-transporting substance.

The viscosity of the hole-collecting layer-forming composition used in the invention, which is suitably adjusted according to the coating method while taking into account the thickness and other properties of the thin film to be formed and the solids concentration, is generally from about 0.1 to about 50 mPa·s at 25° C.

When preparing the hole-collecting layer-forming composition of the invention, the charge-transporting substance, electron-accepting dopant substance and organic solvent can be mixed together in any order, provided that the solids uniformly dissolve or disperse in the solvent. That is, so long as the solids uniformly dissolve or disperse in the organic solvent, any of the following methods may be used: the method of dissolving the charge-transporting substance in the organic solvent, and then dissolving the electron-accepting dopant substance in the resulting solution; the method of dissolving the electron-accepting dopant substance in the organic solvent, and then dissolving the charge-transporting substance in the resulting solution; and the method of mixing together the charge-transporting substance and the electron-accepting dopant substance, and then poring the mixture into and dissolving it within the organic solvent.

Preparation of the composition is generally carried out in an inert gas atmosphere at standard temperature and pressure, although it may be carried out in an open-air atmosphere (in the presence of oxygen) or may be carried out under heating, provided that the compounds within the composition do not decompose and the composition does not undergo any large change in makeup.

The hole-collecting layer of the invention can be formed by coating the above-described hole-collecting layer-forming composition onto the anode of a photosensor element and baking the composition.

During coating, the optimal technique from among various types of wet processes such as drop casting, spin coating, blade coating, dip coating, roll coating, bar coating, die coating, inkjet coating and printing methods (e.g., relief printing, intaglio printing, lithography, screen printing) may be used while taking into account such factors as the viscosity and surface tension of the composition and the desired thickness of the thin film.

Coating is generally carried out in an inert gas atmosphere at standard temperature and pressure, although it may be carried out in an open-air atmosphere (in the presence of oxygen) or may be carried out under heating, provided that the compounds within the composition do not decompose and the composition does not undergo any large change in makeup.

The film thickness is generally from about 1 to about 200 nm, preferably from about 3 to about 100 nm, and more preferably from 5 to 30 nm. Methods for changing the film thickness include methods that involve changing the solids concentration in the composition and methods that involve changing the amount of solution applied during coating.

A method for producing a photosensor element using the hole-collecting layer-forming composition of the invention is described below.

[Formation of Anode Layer]:
  Step of Producing Transparent Electrode by Forming Anode Material Layer on Surface of Transparent Substrate A metal oxide such as indium-tin oxide (ITO) or indium-zinc oxide (IZO) or an organic compound having high charge transportability, such as a polythiophene derivative or a polyaniline derivative, may be used as the anode material. A substrate made of glass or a clear resin may be used as the transparent substrate.

The method of forming the anode material layer (anode layer) is suitably selected according to the nature of the anode material. Generally, either a dry process that uses a sublimable compound (vapor deposition) or a wet process that uses a charge-transporting compound-containing varnish (particularly spin coating or slit coating) is employed.

Commercial products also may be suitably used as the transparent electrode. In this case, from the standpoint of increasing the device yield, the use of a substrate that has been subjected to leveling treatment is preferred. When a commercial product is used, the method of manufacturing the photosensor of the invention does not include an anode layer-forming step.

The transparent electrode is preferably used after being cleaned with, for example, a cleaning agent, alcohol or pure water. For example, anode substrates are preferably subjected to surface treatment such as UV/ozone treatment or oxygen-plasma treatment just prior to use. However, surface treatment need not be carried out if the anode material is composed primarily of organic substances.

[Formation of Hole-Collecting Layer]:
  Step of Forming Hole-Collecting Layer on Layer of Anode Material Using the hole-collecting layer-forming composition of the invention, a hole-collecting layer is formed on the anode material layer in accordance with the above-described method.

[Formation of Photoelectric Conversion Layer]:
  Step of Forming Photoelectric Conversion Layer on Hole-Collecting Layer The photoelectric conversion layer may be a layer obtained by stacking an n layer which is a thin film consisting of an n-type semiconductor material and a p layer which is a thin film consisting of a p-type semiconductor material, or may be a non-stacked thin film consisting of a mixture of these materials.

Illustrative examples of n-type semiconductor materials include fullerenes, [6,6]-phenyl-$C_{61}$-butyric acid methyl ester ($PC_{61}BM$) and [6,6]-phenyl-$C_{71}$-butyric acid methyl ester ($PC_{71}BM$). Illustrative examples of p-type semiconductor materials include regioregular-poly(3-hexylthiophene) (P3HT), PTB7, PDTP-DFBT, polymers having a thiophene skeleton on the main chain, including thienothiophene unit-containing polymers such as those mentioned in JP-A 2009-158921 and WO 2010/008672, phthalocyanines such as CuPC and ZnPC, and porphyrins such as tetrabenzoporphyrin.

Of these, $PC_{61}BM$ and $PC_{71}BM$ are preferred as the n-type material, and polymers having a thiophene skeleton on the main chain, such as PTB7, are preferred as the p-type material.

As used herein, "thiophene skeleton on the main chain" refers to divalent aromatic rings consisting entirely of thiophene, or divalent condensed aromatic rings containing one or more thiophene, such as thienothiophene, benzothiophene, dibenzothiophene, benzodithiophene, naphthothiophene, naphthodithiophene, anthrathiophene and anthradithiophene. These may be substituted with the substituents represented by $R^1$ to $R^6$ above.

The method of forming the photoelectric conversion layer is suitably selected according to the nature of the n-type semiconductor or p-type semiconductor material. A dry process that uses a sublimable compound (especially vapor deposition) or a wet process that uses a semiconductor material-containing varnish (especially spin coating or slit coating) is generally employed.

[Chemical Formula 12]

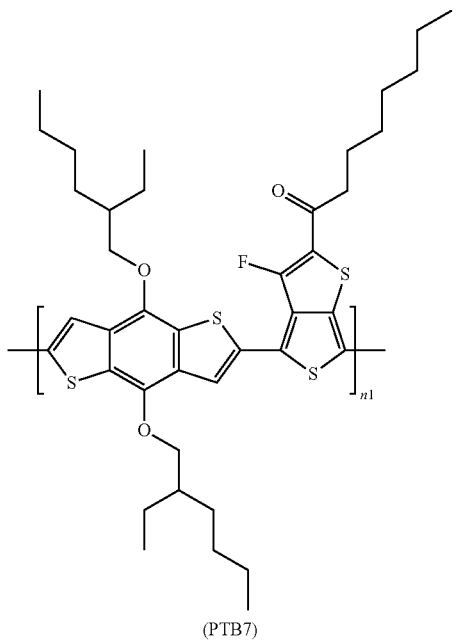

(PTB7)

-continued

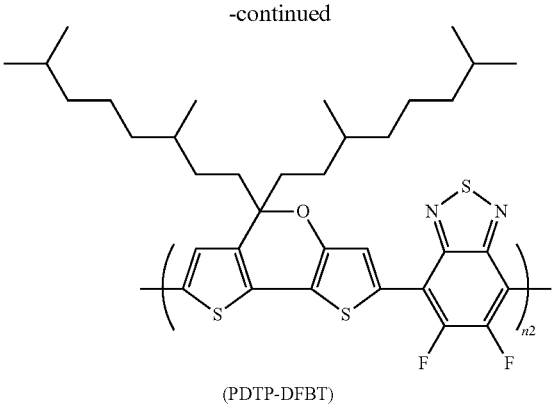

(PDTP-DFBT)

In the above formulas, n1 and n2 are positive integers which indicate the number of repeating units.

[Formulation of Electron-Collecting Layer]:

Step of Forming an Electron-Collecting Layer on Photoelectric Conversion Layer

Where necessary, an electron-collecting layer may be formed between the photoelectric conversion layer and the cathode layer.

Illustrative examples of electron-collecting layer-forming materials include lithium oxide ($Li_2O$), magnesium oxide (MgO), alumina ($Al_2O_3$), lithium fluoride (LiF), magnesium fluoride ($MgF_2$) and strontium fluoride ($SrF_2$).

The method of forming the electron-collecting layer is suitably selected according to the nature of the material. A dry process that uses a sublimable compound (especially vapor deposition) or a wet process that uses a material-containing varnish (especially spin coating or slit coating) is generally employed.

[Formation of Cathode Layer]:

Step of Forming Cathode Layer on Electron-Collecting Layer

Illustrative examples of cathode materials include aluminum, magnesium-silver alloys, aluminum-lithium alloys, lithium, sodium, potassium, cesium, calcium, barium, silver and gold. A plurality of cathode materials may be used by being stacked as multiple layers or mixed together.

The method of forming the cathode layer is suitably selected according to the nature of the material, although a dry process (especially vapor deposition) is typically used.

[Formation of Carrier Block Layers]

Where necessary, carrier block layers may be provided to desired layer intervals for such purposes as to control the rectifiability of the photoelectric current.

Examples of materials that form the carrier block layers include titanium oxide and zinc oxide.

The method of forming a carrier block layer is suitably selected according to the nature of the material. Vapor deposition is generally employed in cases where a sublimable compound is used, and spin coating or slit coating is generally employed when a varnish in which the material has been dissolved is used.

Photosensor elements manufactured by the exemplary method described above, to prevent their deterioration from exposure to the atmosphere, can again be placed in a glovebox and subjected to a sealing operation under a nitrogen or other inert gas atmosphere and, in the sealed state, made to function as photosensor elements or measurement of the device characteristics carried out.

Examples of the sealing method include a method that involves bonding a concave glass substrate having a UVcurable resin attached at the edge to the film-forming side of an organic thin-film solar cell element and curing the resin by UV irradiation, all in an inert gas atmosphere, and a method in which film-type sealing is carried out in a vacuum by a technique such as sputtering.

EXAMPLES

Working Examples and Comparative Examples are given below to more concretely illustrate the invention, although the invention is not limited by these Examples. The equipment used was as follows.
(1) Glovebox: A glovebox system available from Vacuum Atmospheres Company (USA)
(2) Vapor Deposition System: A vapor deposition system from Aoyama Engineering KK
(3) Measurement System:
 ET-4000A fully automated microfigure measuring instrument, from Kosaka Laboratory, Ltd.
(4) Apparatus Used for Measuring Current Values:
 4156C Precision Semiconductor Parameter Analyzer, from Agilent KK
(5) Light Source Apparatus Used for Measuring Photoelectric Current:
 SM-250 Hyper Monolight System, from Bunkoukeiki Co., Ltd.

[1] Preparation of Photoelectric Conversion Layer-Forming Composition

Preparation Example 1

Chlorobenzene (2.0 mL) was added to a sample vial containing 20 mg of PTB7 (available from 1-Material) and 30 mg of $PC_{61}BM$ (available from Frontier Carbon Corporation under the product name "nanom spectra E100"), and the vial contents were stirred for 15 hours on a hot plate set to 80° C. The resulting solution was then allowed to cool to room temperature, following which 60 μL of 1,8-diiodooctane (Tokyo Chemical Industry Co., Ltd.) was added and stirring was carried out, giving Solution A1 (a photoelectric conversion layer-forming composition).

[2] Preparation of Silane Solution

Preparation Example 2

Silane Compound Solution S1 was obtained by adding 0.717 mg (3.61 mmol) of phenyltrimethoxysilane (Shin-Etsu Chemical Co., Ltd.) and 0.394 mg (1.81 mmol) of 3,3,3-trifluoropropyltrimethoxysilane (Shin-Etsu Chemical Co., Ltd.) to 10.0 g of N,N-dimethylacetamide (DMAc) and stirring at room temperature.

[3] Preparation of Hole-Collecting Layer-Forming Compositions

Working Example 1-1

DMAc (3.33 g) and 2,3-butanediol (1.67 g) were added to a mixture of 67.1 mg (0.152 mmol) of the phenyltetraaniline of formula (d) above and 136.9 mg (0.152 mmol) of the arylsulfonic acid compound of above formula (D2) that was synthesized according to the method described in WO 2006/025342 (the same applies below), and the solids were dissolved by stirring at room temperature under ultrasonic irradiation. To this was added 5.0 g of cyclohexanol (CHN) and stirring was carried out, giving a light green-colored solution. The resulting light green-colored solution was filtered with a syringe filter having a pore size of 0.2 μm, giving Hole-Collecting Layer-Forming Composition B1.

The phenyltetraaniline of formula (d) above was synthesized according to the method described in *Bulletin of Chemical Society of Japan*, Vol. 67, pp. 1749-1752 (1994).

Working Example 1-2

DMAc (5.00 g) was added to a mixture of 105.3 mg (0.301 mmol) of oxidized phenyltrianiline and 204.0 mg (0.226 mmol) of the arylsulfonic acid compound of above formula (D2), and the solids were dissolved by stirring at room temperature under ultrasonic irradiation. To this was added 5.0 g of CHN and stirring was carried out, giving a dark green-colored solution. The resulting dark green-colored solution was filtered with a syringe filter having a pore size of 0.2 μm, giving Hole-Collecting Layer-Forming Composition B2.

The oxidized phenyltrianiline was synthesized according to the method described in WO 2008/010474.

Working Example 1-3

DMAc (5.00 g) was added to a mixture of 58.9 mg (0.086 mmol) of the oligoaniline compound of above formula (c) and 160.9 mg (0.161 mmol) of the arylsulfonic acid compound of above formula (D2), and the solids were dissolved by stirring at room temperature under ultrasonic irradiation. To this was added 5.0 g of CHN and stirring was carried out, giving a dark green-colored solution. The resulting dark green-colored solution was filtered with a syringe filter having a pore size of 0.2 giving Hole-Collecting Layer-Forming Composition B3.

The oligoaniline compound of above formula (c) was synthesized according to the method described in WO 2014/141998.

Working Example 1-4

DMAc (5.00 g) was added to a mixture of 51.4 mg (0.075 mmol) of the oxidized form of the oligoaniline compound of above formula (c) and 152.7 mg (0.169 mmol) of the arylsulfonic acid compound of above formula (D2), and the solids were dissolved by stirring at room temperature under ultrasonic irradiation. To this was added 5.0 g of CHN and stirring was carried out, giving a dark green-colored solution. The resulting dark green-colored solution was filtered with a syringe filter having a pore size of 0.2 μm, giving Hole-Collecting Layer-Forming Composition B4.

The oxidized form of the oligoaniline compound of above formula (c) was synthesized according to the method described in WO 2014/119782.

Working Example 1-5

DMAc (5.00 g) was added to a mixture of 87.0 mg (0.259 mmol) of N,N'-diphenylbenzidine (Tokyo Chemical Industry Co., Ltd.) of above formula (g) and 116.7 mg (0.129 mmol) of the arylsulfonic acid compound of above formula (D2), and the solids were dissolved by stirring at room temperature under ultrasonic irradiation. To this was added 5.0 g of CHN and stirring was carried out, giving a light yellow-colored solution. The resulting light yellow-colored solution was filtered with a syringe filter having a pore size of 0.2 μm, giving Hole-Collecting Layer-Forming Composition B5.

Working Example 1-6

DMAc (4.82 g) was added to a mixture of 61.0 mg (0.181 mmol) of N,N'-diphenylbenzidine and 122.8 mg (0.136 mmol) of the arylsulfonic acid compound of above formula (D2), and the solids were dissolved by stirring at room temperature under ultrasonic irradiation. To this was added 5.0 g of CHN and stirring was carried out, after which 0.204 g of Silane Compound Solution S1 obtained in Preparation Example 2 was added, giving a light yellow-colored solution. The resulting light yellow-colored solution was filtered with a syringe filter having a pore size of 0.2 μm, giving Hole-Collecting Layer-Forming Composition B6.

Working Example 1-7

DMAc (5.00 g) was added to a mixture of 101.2 mg (0.228 mmol) of the thiophene derivative of above formula (1) and 102.8 mg (0.114 mmol) of the arylsulfonic acid compound of above formula (D2), and the solids were dissolved by stirring at room temperature under ultrasonic irradiation. To this was added 5.0 g of CHN and stirring was carried out, giving a reddish orange-colored solution. The resulting reddish orange-colored solution was filtered with a syringe filter having a pore size of 0.2 μm, giving Hole-Collecting Layer-Forming Composition B7.

The thiophene derivative of above formula (I) was synthesized according to the method described in WO 2005/043962.

Working Example 1-8

DMAc (5.00 g) was added to a mixture of 37.4 mg (0.055 mmol) of the oligoaniline compound of above formula (c) and 166.3 mg (0.654 mmol) of 5-sulfosalicylic acid (Kanto Chemical Co., Inc.), and the solids were dissolved by stirring at room temperature under ultrasonic irradiation. To this was added 5.0 g of CHN and stirring was carried out, giving a dark green-colored solution. The resulting dark green-colored solution was filtered with a syringe filter having a pore size of 0.2 μm, giving Hole-Collecting Layer-Forming Composition B8.

Working Example 1-9

DMAc (2.5 g) was added to a mixture of 56.7 mg of N,N'-diphenylbenzidine and 45.4 mg of polystyrenesulfonic acid (available as FUNCHEM PSS from Tomiyama Pure Chemical Industries, Ltd.; average molecular weight, 14,000), and the solids were dissolved by stirring at room temperature under ultrasonic irradiation. To this was added 2.5 g of CHN and stirring was carried out, giving Hole-Collecting Layer-Forming Composition B9 as a brown-colored suspension.

Working Example 1-10

DMAc (2.5 g) was added to a mixture of 64.5 mg of N,N'-diphenylbenzidine and 37.7 mg of 1,3,6-naphthalentrisulfonic acid (available as FUNCHEM NTSH from Tomiyama Pure Chemical Industries, Ltd.), and the solids were dissolved by stirring at room temperature under ultrasonic irradiation. To this was added 2.5 g of CHN and stirring was carried out, giving a brown-colored solution. The resulting brown-colored solution was filtered with a syringe filter having a pore size of 0.2 μm, giving Hole-Collecting Layer-Forming Composition B10.

Comparative Example 1-1

PEDOT/PSS (Clevios P VP Al 4083, from Heraeus) which had been ultrasonically re-suspended was filtered with a syringe filter having a pore size of 0.45 μm, giving Hole-Collecting Layer-Forming Composition C1.

[4] Photosensor Element Production

Working Example 2-1

A 20 mm×20 mm glass substrate patterned thereon with, as the positive electrode, an ITO transparent conductive layer in the form of 2 mm×20 mm stripes was subjected to 15 minutes of UV/ozone treatment, following which Hole-Collecting Layer-Forming Composition B1 prepared above was spin-coated onto the substrate. This glass substrate was heated on a hot plate at 50° C. for 5 minutes, and additionally at 230° C. for 20 minutes, thereby forming a hole-collecting layer.

Within a glovebox purged with inert gas, film formation was subsequently carried out by adding Solution A1 dropwise to the resulting hole-collecting layer and spin coating.

Next, the substrate on which an organic semiconductor layer had been formed and a negative electrode mask were placed within a vacuum vapor deposition system, the interior of the system was evacuated to a vacuum of $1 \times 10^{-3}$ Pa or below, and an aluminum layer as the negative electrode was vapor deposited to a thickness of 80 nm by a resistance heating method.

Last of all, 10 minutes of heating at 80° C. was carried out on a hot plate, thereby producing a photosensor element in which the regions where the striped ITO layer and the aluminum layer intersect have surface areas of 2 mm×2 mm.

Working Example 2-2

Aside from using Hole-Collecting Layer-Forming Composition B2 instead of Hole-Collecting Layer-Forming Composition B1 and heating at 120° C. for 10 minutes instead of at 230° C. for 20 minutes, a photosensor element was produced in the same way as in Working Example 2-1.

Working Example 2-3

Aside from using Hole-Collecting Layer-Forming Composition B3 instead of Hole-Collecting Layer-Forming Composition B1, a photosensor element was produced in the same way as in Working Example 2-1.

Working Example 2-4

Aside from using Hole-Collecting Layer-Forming Composition 134 instead of Hole-Collecting Layer-Forming Composition B1 and heating at 120° C. for 10 minutes instead of at 230° C. for 20 minutes, a photosensor element was produced in the same way as in Working Example 2-1.

Working Example 2-5

Aside from using Hole-Collecting Layer-Forming Composition B5 instead of Hole-Collecting Layer-Forming Composition B1, a photosensor element was produced in the same way as in Working Example 2-1.

Working Example 2-6

Aside from using Hole-Collecting Layer-Forming Composition B6 instead of Hole-Collecting Layer-Forming Composition B1, a photosensor element was produced in the same way as in Working Example 2-1.

Working Example 2-7

Aside from using Hole-Collecting Layer-Forming Composition B7 instead of Hole-Collecting Layer-Forming Composition B1 and heating at 230° C. for 30 minutes instead of at 230° C. for 20 minutes, a photosensor element was produced in the same way as in Working Example 2-1.

Working Example 2-8

Aside from using Hole-Collecting Layer-Forming Composition B8 instead of Hole-Collecting Layer-Forming Composition B1 and heating at 230° C. for 15 minutes instead of at 230° C. for 20 minutes, a photosensor element was produced in the same way as in Working Example 2-1.

Working Example 2-9

Aside from using Hole-Collecting Layer-Forming Composition B9 instead of Hole-Collecting Layer-Forming Composition B1, a photosensor element was produced in the same way as in Working Example 2-1.

Working Example 2-10

Aside from using Hole-Collecting Layer-Forming Composition B10 instead of Hole-Collecting Layer-Forming Composition B1, a photosensor element was produced in the same way as in Working Example 2-1.

Comparative Example 2-1

Aside from using Hole-Collecting Layer-Forming Composition C1 instead of Hole-Collecting Layer-Forming Composition B1 and heating at 150° C. for 20 minutes instead of at 230° C. for 20 minutes, a photosensor element was produced in the same way as in Working Example 2-1.

[5] Evaluation of Properties

The dark currents ($A/cm^2$) of the photosensor elements produced above and the photoelectric currents ($A/cm^2$) generated when these photosensor elements were irradiated with light having a wavelength of 550 nm were measured, and the ratio between the photoelectric current and the dark current in each case was determined, based on which the properties of the materials were evaluated. Table 1 shows the evaluation results. In addition, Table 1 also shows the thicknesses of the respective hole-collecting layers.

Current measurement was carried out as follows by placing the photosensor element within a light source apparatus and recording the current value upon applying a voltage of −1 V across the ITO electrode as the anode and the Al electrode as the cathode. The current value when not irradiated with light was measured as the dark current, and the current value when irradiated with light having a wavelength of 550 nm (quantity of light, 4.96 $mW/cm^2$) was measured as the photoelectric current.

TABLE 1

| | Dark current ($A/cm^2$) | Photoelectric current ($A/cm^2$) | Photoelectric current/ Dark current | Hole-collecting layer thickness (nm) |
|---|---|---|---|---|
| Working Example 2-1 | $6.5 \times 10^{-8}$ | $8.6 \times 10^{-4}$ | $1.3 \times 10^4$ | 28 |
| Working Example 2-2 | $2.7 \times 10^{-6}$ | $9.2 \times 10^{-4}$ | $3.4 \times 10^2$ | 26 |
| Working Example 2-3 | $2.7 \times 10^{-7}$ | $9.2 \times 10^{-4}$ | $3.4 \times 10^3$ | 29 |
| Working Example 2-4 | $8.8 \times 10^{-7}$ | $9.1 \times 10^{-4}$ | $1.0 \times 10^3$ | 32 |
| Working Example 2-5 | $6.0 \times 10^{-8}$ | $9.3 \times 10^{-4}$ | $1.5 \times 10^4$ | 8 |
| Working Example 2-6 | $4.7 \times 10^{-7}$ | $9.4 \times 10^{-4}$ | $2.0 \times 10^3$ | 7 |
| Working Example 2-7 | $3.6 \times 10^{-8}$ | $8.0 \times 10^{-4}$ | $2.2 \times 10^4$ | 26 |
| Working Example 2-8 | $1.9 \times 10^{-8}$ | $9.3 \times 10^{-4}$ | $5.0 \times 10^4$ | 7 |
| Working Example 2-9 | $7.8 \times 10^{-9}$ | $3.7 \times 10^{-5}$ | $4.7 \times 10^3$ | 8 |
| Working Example 2-10 | $2.4 \times 10^{-8}$ | $3.9 \times 10^{-5}$ | $1.6 \times 10^3$ | 5 |
| Comparative Example 2-1 | $1.3 \times 10^{-5}$ | $1.0 \times 10^{-3}$ | $7.8 \times 10^1$ | 15 |

As shown in Table 1, compared with the photosensor element in the Comparative Example, in the photosensor elements produced in the Working Examples of the invention, the dark current was suppressed and the ratio between the photoelectric current and the dark current was large.

It is thus apparent that, by using the hole-collecting layer-forming compositions of the invention, photosensor elements having a high sensitivity can be produced.

The invention claimed is:

1. A photosensor element comprising an anode layer, a hole-collecting layer provided so as to be in contact with the anode layer, and a photoelectric conversion layer provided so as to be in contact with the hole-collecting layer,
    wherein the hole-collecting layer made from the photosensor element hole-collecting layer-forming composition comprises a charge-transporting substance having a molecular weight of from 200 to 2,000 and an organic solvent.

2. The photosensor element of claim 1, wherein the charge-transporting substance is at least one selected from the group consisting of aniline derivatives and thiophene derivatives.

3. The photosensor element of claim 2, wherein the aniline derivatives and thiophene derivatives are represented by formula (H1), (H2) or (H3),

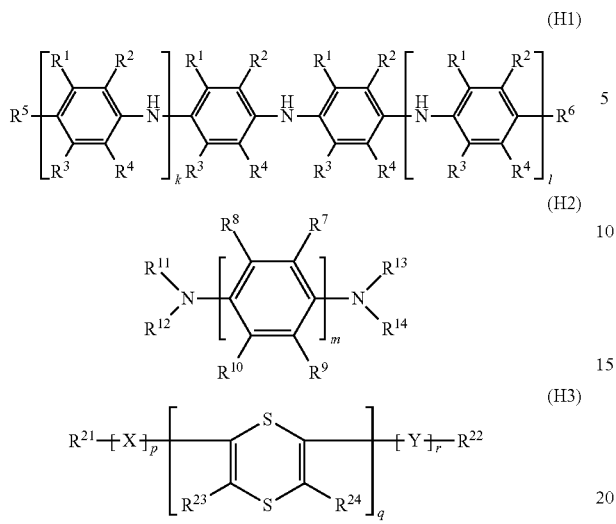

(H1)

(H2)

(H3)

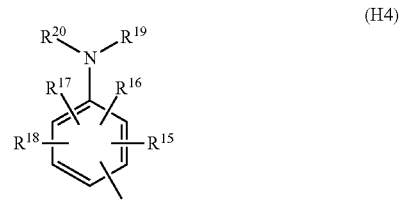

(H4)

wherein $R^1$ to $R^6$ are each independently a hydrogen atom, a halogen atom, a nitro group, a cyano group, an amino group, an alkyl group of 1 to 20 carbon atoms, alkenyl group of 2 to 20 carbon atoms or alkynyl group of 2 to 20 carbon atoms which may be substituted with $Z^1$, an aryl group of 6 to 20 carbon atoms or heteroaryl group of 2 to 20 carbon atoms which may be substituted with $Z^2$, or a —$NHY^1$, —$NY^2Y^3$, —$OY^4$ or —$SY^5$ group; $Y^1$ to $Y^5$ are each independently an alkyl group of 1 to 20 carbon atoms, alkenyl group of 2 to 20 carbon atoms or alkynyl group of 2 to 20 carbon atoms which may be substituted with $Z^1$, or an aryl group of 6 to 20 carbon atoms or heteroaryl group of 2 to 20 carbon atoms which may be substituted with $Z^2$; $Z^1$ is a halogen atom, a nitro group, a cyano group, an amino group, or an aryl group of 6 to 20 carbon atoms or heteroaryl group of 2 to 20 carbon atoms which may be substituted with $Z^3$; $Z^2$ is a halogen atom, a nitro group, a cyano group, an amino group, or an alkyl group of 1 to 20 carbon atoms, alkenyl group of 2 to 20 carbon atoms or alkynyl group of 2 to 20 carbon atoms which may be substituted with $Z^3$; $Z^3$ is a halogen atom, a nitro group, a cyano group, or an amino group; and the letters k and l are each independently integers from 1 to 5, wherein $R^7$ to $R^{10}$ are each independently a hydrogen atom, a halogen atom, a nitro group, a cyano group, a hydroxyl group, a thiol group, a phosphoric acid group, a sulfonic acid group, a carboxyl group, an alkoxy group of 1 to 20 carbon atoms, thioalkoxy group of 1 to 20 carbon atoms, alkyl group of 1 to 20 carbon atoms, alkenyl group of 2 to 20 carbon atoms or alkynyl group of 2 to 20 carbon atoms which may be substituted with $Z^1$, or an aryl group of 6 to 20 carbon atoms, aralkyl group of 7 to 20 carbon atoms or acyl group of 1 to 20 carbon atoms which may be substituted with $Z^2$; $R^{11}$ to $R^{14}$ are each independently a hydrogen atom, a phenyl, naphthyl, pyridyl, pyrimidinyl, pyridazinyl, pyrazinyl, furanyl, pyrrolyl, pyrazolyl, imidazolyl or thienyl group (which groups may be substituted with a halogen atom, a nitro group, a cyano group, a hydroxyl group, a thiol group, a phosphoric acid group, a sulfonic acid group, a carboxyl group, an alkoxy group of 1 to 20 carbon atoms, a thioalkoxy group of 1 to 20 carbon atoms, an alkyl group of 1 to 20 carbon atoms, a haloalkyl group of 1 to 20 carbon atoms, an alkenyl group of 2 to 20 carbon atoms, an alkynyl group of 2 to 20 carbon atoms, an aryl group of 6 to 20 carbon atoms, an aralkyl group of 7 to 20 carbon atoms, or an acyl group of 1 to 20 carbon atoms), or a group of formula (H4) (provided that at least one of $R^{11}$ to $R^{14}$ is a hydrogen atom); m is an integer from 2 to 5; and $Z^1$ and $Z^2$ are as defined above, wherein $R^{15}$ to $R^{18}$ are each independently a hydrogen atom, a halogen atom, a nitro group, a cyano group, a hydroxyl group, a thiol group, a phosphoric acid group, a sulfonic acid group, a carboxyl group, an alkoxy group of 1 to 20 carbon atoms, thioalkoxy group of 1 to 20 carbon atoms, alkyl group of 1 to 20 carbon atoms, alkenyl group of 2 to 20 carbon atoms or alkynyl group of 2 to 20 carbon atoms which may be substituted with $Z^1$, or an aryl group of 6 to 20 carbon atoms, aralkyl group of 7 to 20 carbon atoms or acyl group of 1 to 20 carbon atoms which may be substituted with $Z^2$; $R^{19}$ and $R^{20}$ are each independently a phenyl, naphthyl, anthryl, pyridyl, pyrimidinyl, pyridazinyl, pyrazinyl, furanyl, pyrrolyl, pyrazolyl group, imidazolyl or thienyl group (which groups may be bonded to each other to form a ring or may be substituted with a halogen atom, a nitro group, a cyano group, a hydroxyl group, a thiol group, a phosphoric acid group, a sulfonic acid group, a carboxyl group, an alkoxy group of 1 to 20 carbon atoms, a thioalkoxy group of 1 to 20 carbon atoms, an alkyl group of 1 to 20 carbon atoms, a haloalkyl group of 1 to 20 carbon atoms, an alkenyl group of 2 to 20 carbon atoms, an alkynyl group of 2 to 20 carbon atoms, an aryl group of 6 to 20 carbon atoms, an aralkyl group of 7 to 20 carbon atoms, or an acyl group of 1 to 20 carbon atoms); and $Z^1$ and $Z^2$ are as defined above, and wherein $R^{21}$ to $R^{24}$ are each independently a hydrogen atom, a halogen atom, a hydroxyl group, an amino group, a silanol group, a thiol group, a carboxyl group, a sulfonic acid group, a phosphoric acid group, a phosphoric acid ester group, an ester group, a thioester group, an amide group, a nitro group, an alkyl group of 1 to 20 carbon atoms, alkenyl group of 2 to 20 carbon atoms or alkynyl group of 2 to 20 carbon atoms which may be substituted with $Z^1$, an aryl group of 6 to 20 carbon atoms, aralkyl group of 7 to 20 carbon atoms or acyl group of 1 to 20 carbon atoms which may be substituted with $Z^2$, a sulfonic acid group, or a —$NHY^1$, —$NY^2Y^3$, —$OY^4$, —$SY^5$ or —$SiY^6Y^7Y^8$ group; $Y^1$ to $Y^8$ are each independently an alkyl group of 1 to 20 carbon atoms, alkenyl group of 2 to 20 carbon atoms or alkynyl group of 2 to 20 carbon atoms which may be substituted with $Z^1$, or an aryl group of 6 to 20 carbon atoms or heteroaryl group of 2 to 20 carbon atoms which may be substituted with $Z^2$; X and Y are each independently a thiophene ring which may be substituted with $Z^2$; the two sulfur atoms included on the dithiine ring may be each independently a SO group or a $SO_2$ group; p, q and r are each independently 0 or an integer of 1 or more, these being numbers that together satisfy the condition p+q+r 20; and $Z^1$ and $Z^2$ are as defined above.

4. The photosensor element of claim 1 which further comprises an electron-accepting dopant substance.

5. The photosensor element of claim 1, wherein the electron-accepting dopant substance includes an arylsulfonic acid compound.

6. The photosensor element of claim 5, wherein the arylsulfonic acid compound is a naphthalene or anthracenesulfonic acid compound of formula (D1) below

[Chemical Formula 1]

(D1)

(wherein Z is oxygen; A is a naphthalene ring or an anthracene ring; B is a divalent to tetravalent perfluorobiphenyl group; the subscript s, which represents the number of sulfonic acid groups bonded to A, is an integer that satisfies the condition 1≤s≤4; and the subscript t, which represents the number of bonds between B and Z, is an integer from 2 to 4), naphthalenetrisulfonic acid or polystyrenesulfonic acid.

7. The photosensor element of claim 6, wherein A is a naphthalene ring.

8. The photosensor element of claim 1 which further comprises an organosilane compound.

9. The photosensor element of claim 1, wherein the photoelectric conversion layer includes a fullerene derivative.

10. The photosensor element of claim 1, wherein the photoelectric conversion layer includes a polymer having a thiophene skeleton on the main chain.

11. The photosensor element of claim 1, wherein the photoelectric conversion layer includes a fullerene derivative and a polymer having a thiophene skeleton on the main chain.

* * * * *